United States Patent [19]
Kosmowski

[11] Patent Number: 5,997,223
[45] Date of Patent: Dec. 7, 1999

[54] HIGH SPEED DRILLING SPINDLE WITH RECIPROCATING CERAMIC SHAFT AND EDOUBL-GRIPPING CENTRIFUGAL CHUCK

[75] Inventor: Wojciech B. Kosmowski, San Juan Capistrano, Calif.

[73] Assignee: Electro Scientific Industries, Inc., Portland, Oreg.

[21] Appl. No.: 09/158,385

[22] Filed: Sep. 22, 1998

[51] Int. Cl.[6] .................................................. B23B 39/10
[52] U.S. Cl. ........................................ 408/124; 409/231
[58] Field of Search .................................. 408/124, 129, 408/238; 409/231, 139

[56] References Cited

U.S. PATENT DOCUMENTS

| | | | |
|---|---|---|---|
| 2,310,990 | 2/1943 | Osgood | 408/124 |
| 2,954,674 | 10/1960 | Kane | 60/54.5 |
| 3,687,467 | 8/1972 | Kosmowski | 279/1 B |
| 3,700,250 | 10/1972 | Bautz | 279/35 |
| 4,017,203 | 4/1977 | Marantette et al. | 408/240 |
| 4,088,417 | 5/1978 | Kosmowski | 408/1 BD |
| 4,095,855 | 6/1978 | Fox | 308/9 |
| 4,135,847 | 1/1979 | Hemmings | 408/226 |
| 4,191,385 | 3/1980 | Fox et al. | 277/3 |
| 4,520,551 | 6/1985 | Imhof | 29/568 |
| 4,596,067 | 6/1986 | Raiteri | 29/568 |
| 4,654,956 | 4/1987 | Reed et al. | 29/568 |
| 4,761,876 | 8/1988 | Kosmowski | 29/568 |
| 4,869,626 | 9/1989 | Kosmowski | 408/124 |
| 4,957,398 | 9/1990 | Schneider et al. | 408/124 |
| 5,009,554 | 4/1991 | Kameyama et al. | 408/238 |
| 5,068,958 | 12/1991 | Kosmowski | 29/568 |
| 5,145,298 | 9/1992 | Marantette | 409/135 |
| 5,230,685 | 7/1993 | Christen et al. | 483/55 |
| 5,350,263 | 9/1994 | Fedeli | 409/231 |
| 5,518,346 | 5/1996 | Geise | 409/132 |
| 5,529,441 | 6/1996 | Kosmowski et al. | 408/1 R |

FOREIGN PATENT DOCUMENTS

| | | |
|---|---|---|
| 1552197 | of 1969 | Germany . |
| 2047311 | of 1969 | Germany . |
| 26 24 644 A1 | 12/1977 | Germany . |

OTHER PUBLICATIONS

Japanese Patent Abstract, vol. 6, No. 14(M–108) (892), Jan. 27, 1982 [JP 56–134109], T. Hori.

*Primary Examiner*—Andrea L. Pitts
*Assistant Examiner*—Adesh Bhargava
*Attorney, Agent, or Firm*—Larry K. Roberts

[57] ABSTRACT

A spindle capable of operation at 200,000 revolutions per minute (RPM) with a reciprocating shaft design to minimize the moving mass. The spindle has a ceramic spindle shaft to decrease the moving mass and increase the shaft stiffness for better dynamic stability. The spindle employs a built-in linear motor to provide direct drilling motion to move the shaft along the axis, and a permanent magnet DC brushless motor to rotate the spindle shaft. The linear motor is coupled to the shaft by a combination of an air bearing and a magnetic thrust bearing to reduce the size of the thrust area for better dynamic stability and reduction in stresses of material. A double gripping centrifugal chuck is mounted in the hollow ceramic shaft, and reduces drill bit runout.

34 Claims, 8 Drawing Sheets

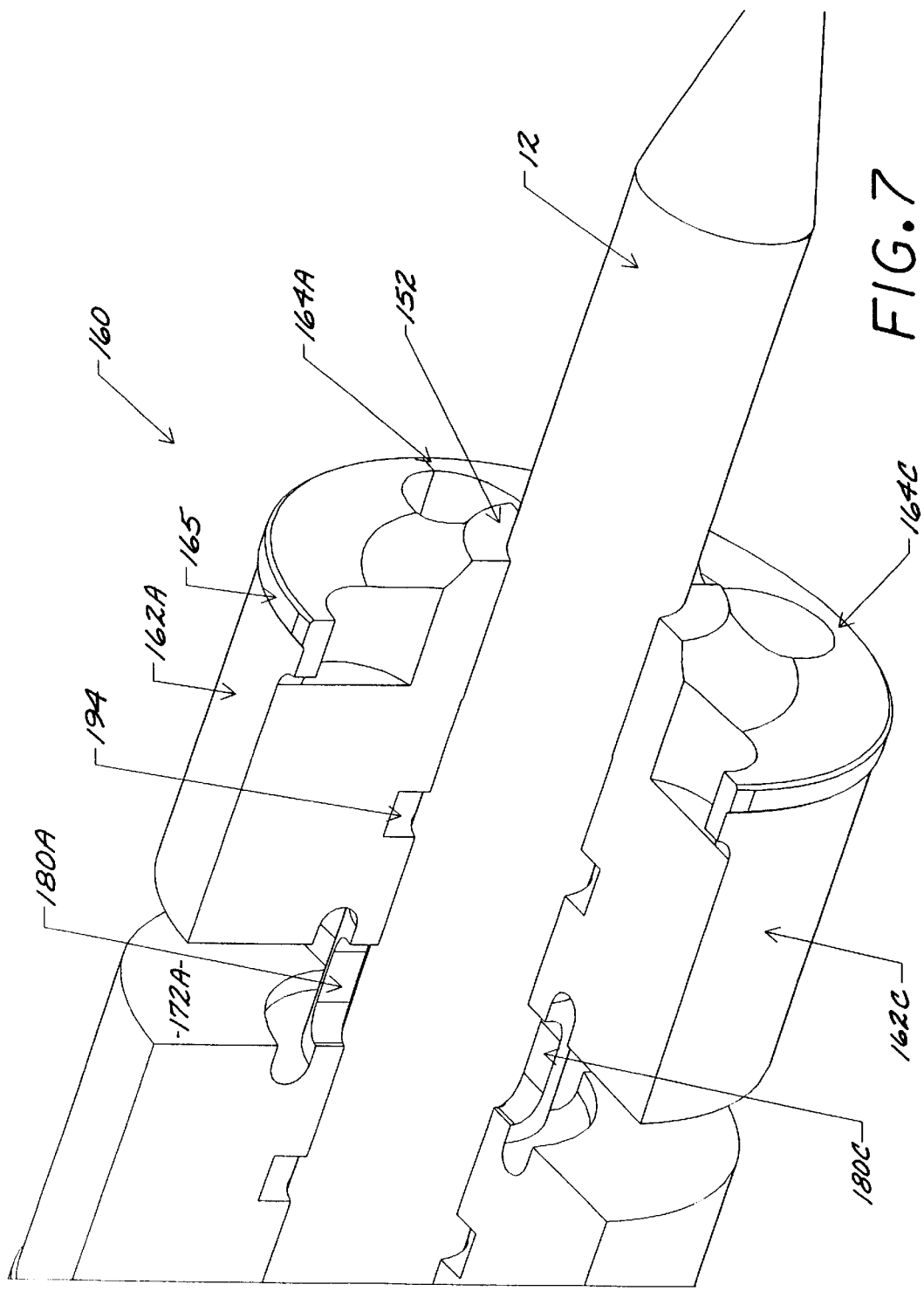

HIGH SPEED DRILLING SPINDLE WITH RECIPROCATING CERAMIC SHAFT AND EDOUBL-GRIPPING CENTRIFUGAL CHUCK

TECHNICAL FIELD OF THE INVENTION

This invention relates to high speed drilling systems for precision drilling of work pieces such as printed circuit boards and the like, and more particularly to systems for drilling very small diameter holes in such work pieces at high speed.

BACKGROUND OF THE INVENTION

Printed circuit boards are typically populated with many surface-mounted circuit devices. Many small holes are formed in the boards to interconnect the layers of the circuit board. Printed circuit boards are also populated with other types of devices which also need holes formed in the boards.

Drilling machines are typically used to drill the holes in the printed circuit boards. One exemplary type of system is described in U.S. Pat. No. 4,761,876, the entire contents of which are incorporated herein by this reference.

There has been a dramatic increase in the hole count on printed circuit boards, which makes the cost of drilling the holes a significant part of the total production cost. In addition, hole sizes are getting smaller. Small drills are more expensive and can not be fed with the same velocity as larger drills. Due to this fact, drilling time and cost are further increased.

To increase the throughput, higher drill bit rotation rates can be employed. However, there is a limit on the spindle rotation rate, which is due to the effect of the large centrifugal forces acting on the spindle rotors at very high rotation rates. Typically, the spindle is fabricated as a solid rod of steel, which will have a growth in the rotor diameter due to centrifugal force at very high rotation rates. Because the rotor typically is supported on air bearings with relatively small gaps between the bearing structure and the rotor, the growth in the rotor diameter will close or significantly narrow these bearing gaps, leading to seizure of the rotor in the bearings.

Drilling spindles typically use a chuck such as a centrifugal chuck to grip the drilling tool while it is being rotated. Centrifugal chucks are advantageous since the tool can be changed without mechanically operating a release mechanism, as there is no gripping centrifugal force when the chuck is not rotated. Small drill applications can have very small drill bit runout tolerances, which can be difficult to achieve with centrifugal chucks in a single grip configuration.

It would therefore represent an advance in the art to provide a spindle capable of extremely high drilling speeds.

It would also be an advantage to provide a centrifugal chuck capable of gripping tools with significantly reduced run-out.

SUMMARY OF THE INVENTION

This invention provides many advantages and features. One aspect of the invention is a spindle capable of operation at 200,000 revolutions per minute (RPM) with a reciprocating shaft design to minimize the moving mass. Another aspect of the invention is a double gripping centrifugal chuck for a drilling spindle to reduce drill bit run-outs.

In accordance with a further aspect of the invention, a combination of an air bearing and a magnetic thrust bearing is employed to reduce the size of the thrust area for better dynamic stability and reduction in stresses of material.

A drilling spindle in accordance with another aspect of the invention includes a ceramic spindle shaft to decrease the moving mass and increase the shaft stiffness for better dynamic stability. The spindle employs a built-in linear motor to provide direct drilling motion, and a permanent magnet DC brushless motor to rotate the spindle shaft.

In one exemplary embodiment, a high speed drilling spindle in accordance with the invention includes a spindle body, a rotatable rotor shaft supported within the spindle body for high speed rotation about a rotor axis. The rotor shaft is fabricated of a ceramic material capable of withstanding centrifugal forces exerted during high rotation rates without significant diametrical growth of the rotor shaft. A rotary air bearing supports the rotor shaft for high speed rotation with low frictional drag within the spindle body. A rotary drive system imparts rotational drive forces to the rotor shaft so as to rotate the shaft on the rotary bearing at high speeds. A linear drive system imparts an axially directed drive force to the rotor shaft to perform drilling movements. A thrust bearing couples the linear drive system to the rotor shaft, and includes an air bearing and a magnetic thrust bearing.

The rotary drive system includes a DC brushless permanent magnet motor, with a permanent magnet mounted within an opening formed in the rotor shaft.

The spindle includes a centrifugal chuck mounted in the rotor shaft, holding a tool having a tool shank in place during high speed rotation to perform tool operations. The chuck is adapted to grip the drill shank at two separated points along the shank to guarantee parallelism of the shank to the axis of rotation. The chuck includes a uni-body flexure which has two gripping segments, the first gripping segment at a front end of the chuck and the second gripping segment at a back end of the chuck. Each gripping segment includes a plurality of weights distributed about the chuck axis and which are joined by flexures to form a uni-body construction.

BRIEF DESCRIPTION OF THE DRAWING

These and other features and advantages of the present invention will become more apparent from the following detailed description of an exemplary embodiment thereof, as illustrated in the accompanying drawings, in which:

FIG. 7 is a partially broken-away isometric view of the front end of the centrifugal chuck.

DETAILED DESCRIPTION OF THE PREFERRED EMBODIMENT

The Spindle

Figure 1A:
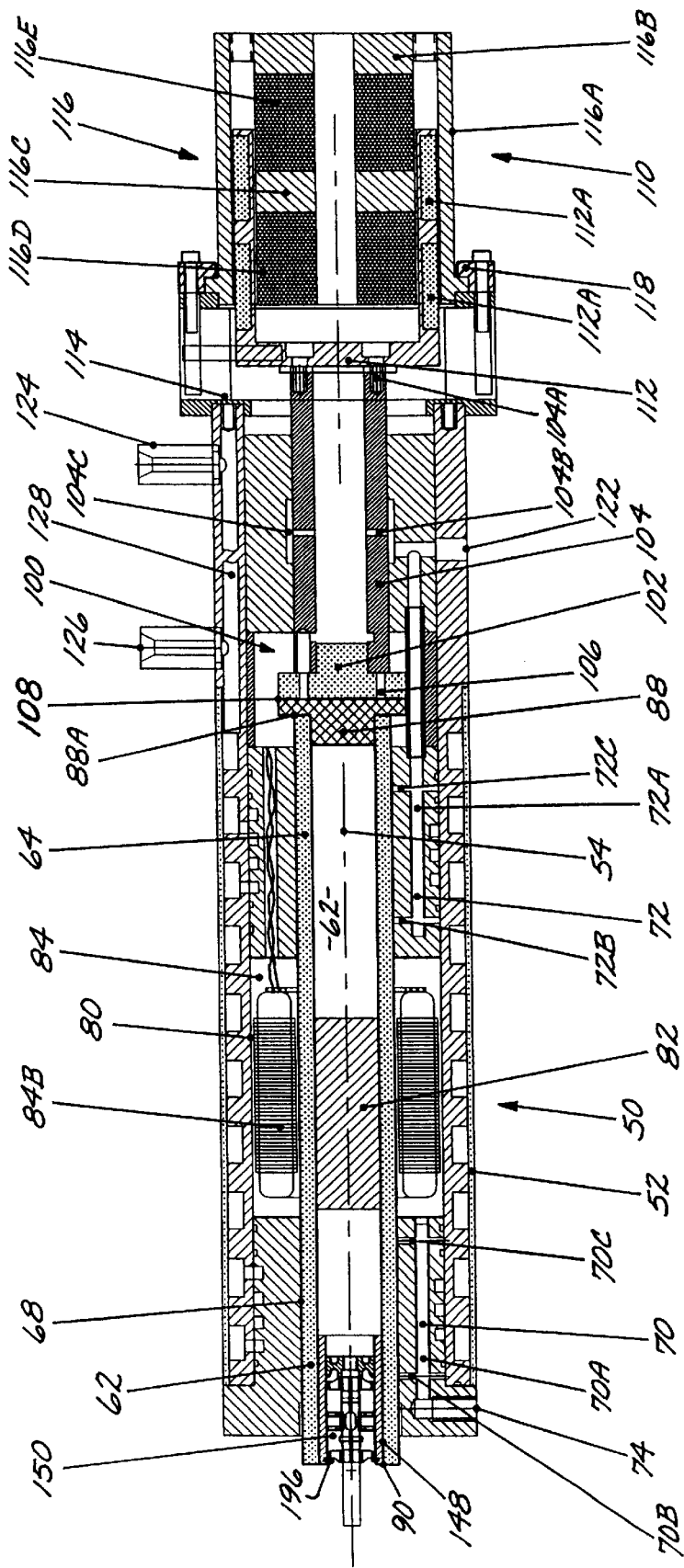
FIG. 1A is a side cross-sectional view of a drilling spindle in accordance with aspects of this invention.

FIG. 1 is a side cross-sectional view of an exemplary drilling spindle 50 embodying aspects of the present invention. The spindle includes a spindle housing 52, which in an exemplary embodiment is stationary in a rotational sense. The spindle 50 is typically mounted on an overhead beam or gantry, in the manner illustrated in U.S. Pat. No. 4,761,876. A work piece is positioned on a work table below the gantry, which is moved relative to the spindle by an X-Y positioning system. In this embodiment, the spindle is fixed in the X-Y sense, although in other applications, it can be moved in the X-Y as well as Z directions to provide relative motion to position the spindle and the work piece and for other functions such as tool changing.

A reciprocating spindle shaft 60 is mounted within the spindle body 52, and is rotatable, by a rotary drive system, and axially movable, by a linear drive system, to advance/retract the shaft along the spindle axis 54. The shaft is shown in the advanced, down position in FIG. 1. Instead of being fabricated of a steel, the shaft is fabricated of a material which is very stiff and which has significantly less diametric growth than a steel shaft at high shaft revolution rates. In this exemplary embodiment, the reciprocating shaft 60 is fabricated of a ceramic material to obtain a shaft of high stiffness (high Young's modulus), relatively low weight, and low diametric growth at high revolution rates. An exemplary ceramic material is the product UL 600 of Coors Ceramic Company, 600 Ninth Street, Golden, Colo. 80401, which is believed to be 96% alumina, with a Young's modulus value of 44 million, and which is fabricated to produce a sintered alumina ceramic tube. In contrast, tool steel has a typical Young's modulus value on the order of 30 million, and so the ceramic tube is much stiffer. Ceramic tubes suitable for the purpose can be fabricated by those skilled in the industrial ceramics art.

In one exemplary embodiment, the shaft is a hollow tube having an outer diameter of 0.7 inch, an inner diameter of 0.5 inch, and a length of 6 inches. This tube has a typical weight of 0.3 pound, in contrast to an all metal shaft which could weigh 0.75 pounds or more. The shaft is reciprocated along the shaft axis in the spindle through a range of 0.4 inch. A conventional spindle with a non-reciprocating shaft, requiring the entire spindle to be moved up/down, can weight 12–20 pounds.

The shaft 60 is captured in two radial air bearings 70, 72. The first air bearing 70 is at the front (distal) end 62 of the shaft. The second air bearing 72 is at the back (interior) end 64 of the shaft. Air bearing 70 is supplied with pressurized air from an air supply connected at port 74, through passageway 70A and transverse openings including openings 70B, 70C formed in the body and extending radially about the shaft opening. Air bearing 72 is supplied with pressurized air from an air supply connected at port 122, through passageway 72A and transverse openings including openings 72B, 72C formed in the body and extending radially about the shaft opening. The radial air bearings support the shaft 60 during rotation and also allow it to move up and down along the rotating axis 54.

The ceramic shaft 60 is a hollow tubular shaft, with a hole 62 running through its center. A centrifugal chuck 150 is mounted in a steel sleeve 148 attached in the front end of the shaft within the hole 62. The function of the sleeve is to distribute local stresses and prevent fracturing of the ceramic shaft 60. The sleeve can be very lightly pressed into place within the hole 62, or preferably secured in place by epoxy. In accordance with an aspect of the invention, the shaft 60 is supported for rotation at rates which can exceed 200,000 revolutions per minute. The shaft is driven by a rotary drive system comprising a DC permanent magnet brushless motor 80. In accordance with another aspect of the invention, the motor includes a rare earth permanent magnet 82 mounted in the middle of the shaft 60 within the hole 62, and preferably secured in place by epoxy. The permanent magnet DC motor 80 further includes a stator circuit 84 mounted in the bore of the spindle housing 52 between the radial air bearings 70, 72. The stator circuit 84 includes a plurality of stator structures 84A each having a stator winding 84B wound thereon. The magnet 82 has formed therein axially aligned north and south poles. A DC motor driver provides excitation signals to the stator windings 84B, setting up electromagnetic fields which act on the magnet 82, imparting a rotational force to the magnet and thus to the shaft.

Figure 2:
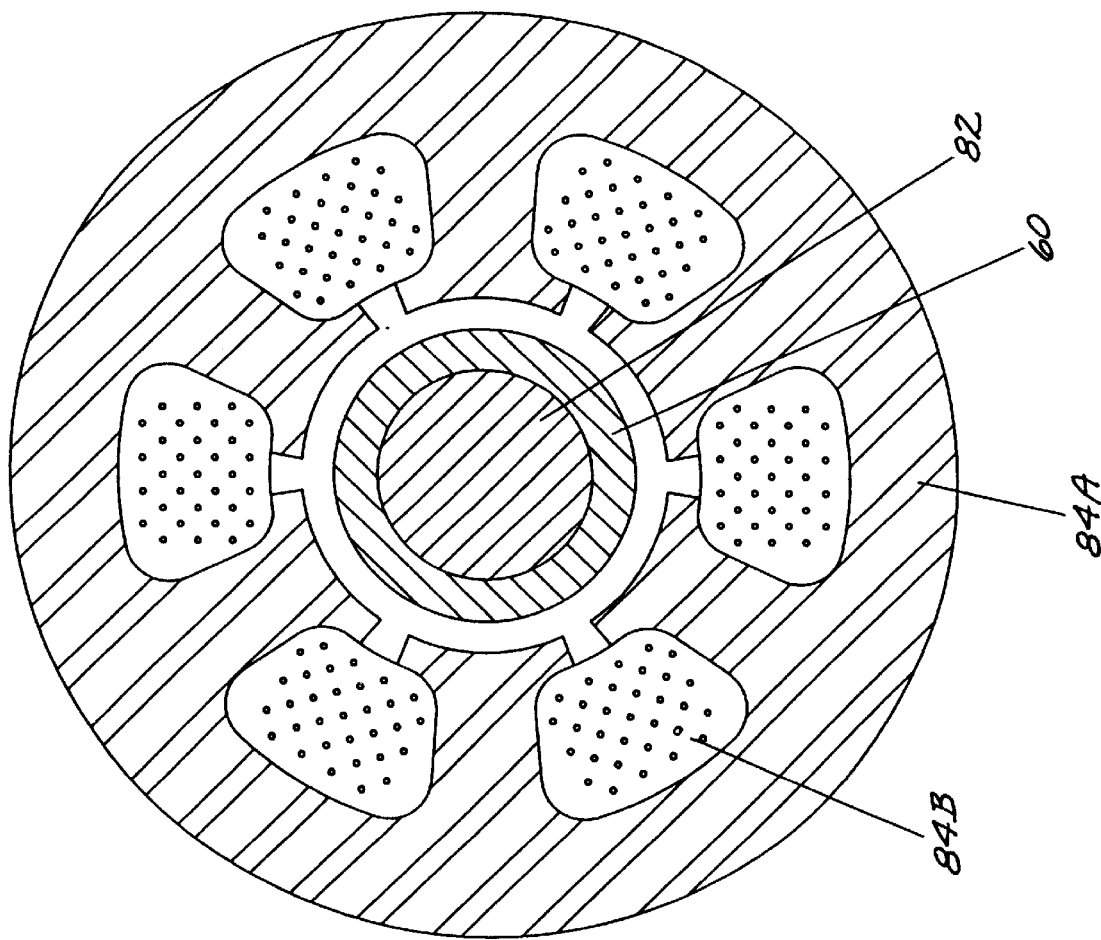
FIG. 2 is a schematic view illustrative of general magnetic elements of the motor providing the rotary drive for the drilling spindle of FIG. 1.

FIG. 2 is a schematic view illustrative of general magnetic elements of the rotary drive motor 80. In this schematic end view, the north and south poles of the magnet 82 are represented as N and S, respectively. The stator lamination structures 84A and the windings 84B are depicted schematically. As shown therein, the magnet 82 is disposed within the opening in the hollow shaft tube. A metal sleeve (not shown) could be used to line the inside of the shaft tube in the region in which the magnet is positioned. This exemplary form of motor is a 2-pole, 3-phase motor, although other types of electrical motors could alternatively be employed.

It is noted that rare earth magnet DC brushless motors are generally known in the art, as well as techniques for driving the motors. The placement of the magnet within a hollow spindle shaft is not known. At high rotation rates, the magnet will tend to have diametrical growth due to the high centrifugal forces exerted on the magnet during rotation. If the magnet were to be placed on the external periphery of the shaft, this diametrical growth could lead to magnet damage or seizure of the rotor. However, the ceramic shaft 60 is stiff enough to withstand the centrifugal force without a significant diametrical expansion, and to hold the magnet within the shaft opening.

Again referring to FIG. 1A, a steel thrust plate 88 is attached at the back end of the shaft 60, e.g. by epoxy. The plate 88 defines a flange 88A having a diameter larger than the outer diameter of the shaft 60. The purpose of the flange is to prevent the shaft 60 from sliding out of the spindle body. The flange 88A will contact the air bearing structure to provide a lower travel stop on the axial movement of the shaft.

The spindle 50 thus comprises a shaft assembly 90 with several components, including the hollow ceramic shaft 60, the centrifugal chuck 150 for holding the drill bit, the permanent magnet 82 to provide rotation to the shaft, and the thrust plate 88. The thrust plate 88 accepts the Z-axis driving motion applied to the shaft 60 through a thrust bearing 100 from the linear drive system 110. The thrust bearing 100 includes a thrust bearing slider 104.

The thrust bearing 100 provides the combination of a magnetically-attracted and an air-pressure-repelled thrust bearing in this embodiment to reduce the area required for the thrust bearing. This reduction in the thrust bearing area decreases the stress level in the thrust bearing flange 88A. The thrust plate 88 is attracted toward a magnet plate 102 installed in the forward end of the thrust bearing slider 104, and repelled at the same time by an air thrust bearing 106 built into the magnet plate 102. Air pressure between the magnet plate 102 and the thrust plate 88 creates a gap at interface 108 between these two components and allows the shaft 62 to rotate in respect to the thrust bearing slider 104 which does not rotate. The magnet plate 102 is a permanent magnet structure. The air bearing 106 is supplied by pressurized air at port 122.

The thrust bearing slider 104 is captured in two radial air bearings 104B, 104C which keep it in position and allow up and down reciprocating motion to drive the spindle shaft 60 and the drill bit into the work piece. This motion is generated by the linear motor 110 attached to the back of the spindle.

Figure 1B:
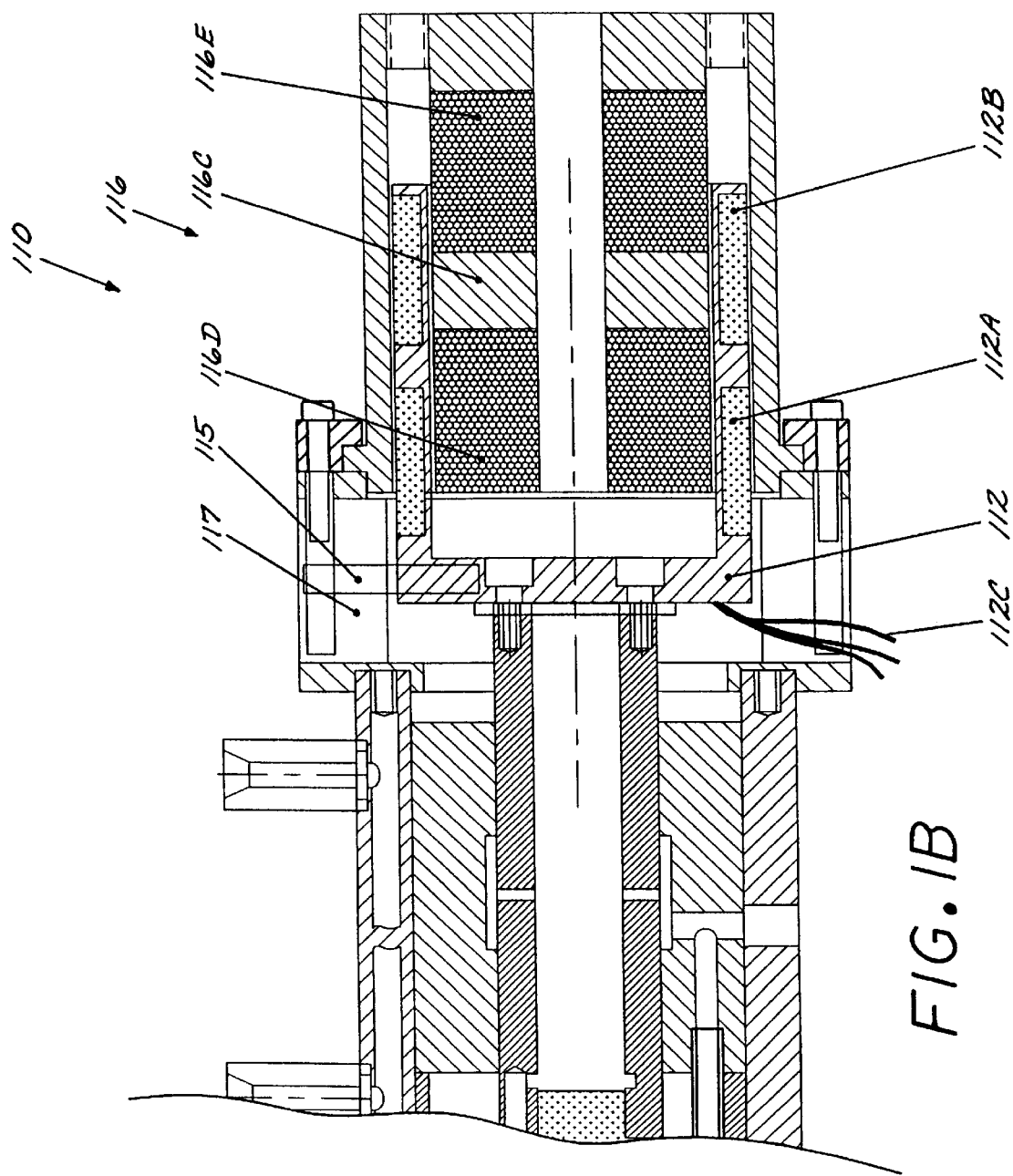
FIG. 1B is a partial cross-sectional view of the spindle of FIG. 1A, rotated with respect to FIG. 1A and showing elements of the linear motor in further detail.

The drive system 110 includes a linear motor comprising a motor coil structure 112 formed in a cup-like configuration, with coil windings 112A and 112B wound about the periphery of the cup-like structure, as shown in FIGS. 1A and 1B. in an exemplary embodiment, the coil structure 112 is fabricated of aluminum, and is cooled by air. The thrust bearing slider 104 is attached to the coil structure 112 by fasteners 104A, and is provided with an anti-rotation device which is attached to the linear motor coil 112, and interacts with the wall of linear motor adapter 114. The anti-rotation device is a pin 115 which slides in a slot 117 formed in the linear motor housing. A pair of TEFLON (TM) dowels is disposed on either side of the pin within the slot to guide the pin in the slot. The pin 115 extends from the coil structure which rides up/down within a slot formed in the adaptor housing.

A linear motor magnet assembly 116 is attached by a clamping device 118 into the linear motor adapter 114, which is secured at the upper end of the spindle housing structure 52. The magnet assembly 116 includes an iron cylinder 116A, and iron core elements 116B, 116C supported inside the cylinder 116A, which sandwich permanent magnets 116D and 116E. The magnet assembly 116 is stationary, while the coil structure 112 moves axially along axis 54 within a gap between the cylinder 116A and the sandwiched iron core elements 115 and magnets 116C in response to linear motor drive signals applied to the coil windings. In this exemplary embodiment, the linear motor provides an axial range of movement to the shaft of 0.4 inch, although other applications may require different movement ranges. The excitation drive signals to the linear motor are provided on a set of leads 119 which are coupled to the linear motor driver.

Air to all air bearings is distributed to fittings at port 122. Cooling water is also distributed through input fitting 124, into the spindle body and output through output fitting 126, and is routed within passageways 128 within the spindle body around the air bearings end to the DC permanent magnet brushless motor 80 to keep the spindle at constant temperature.

Figure 3:
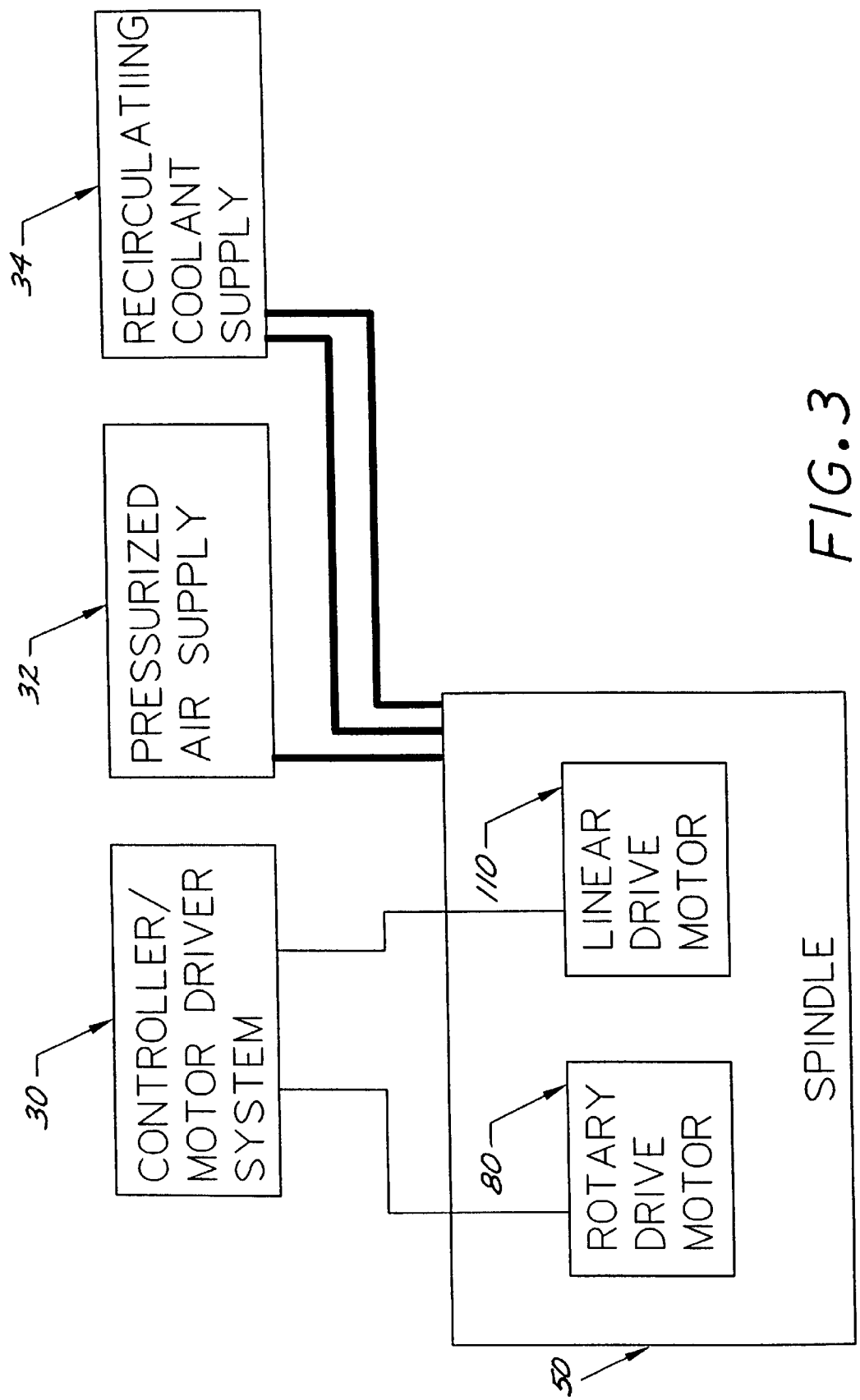
FIG. 3 is a functional block diagram of the spindle and the ancillary system elements for operating the spindle.
Figure 4:
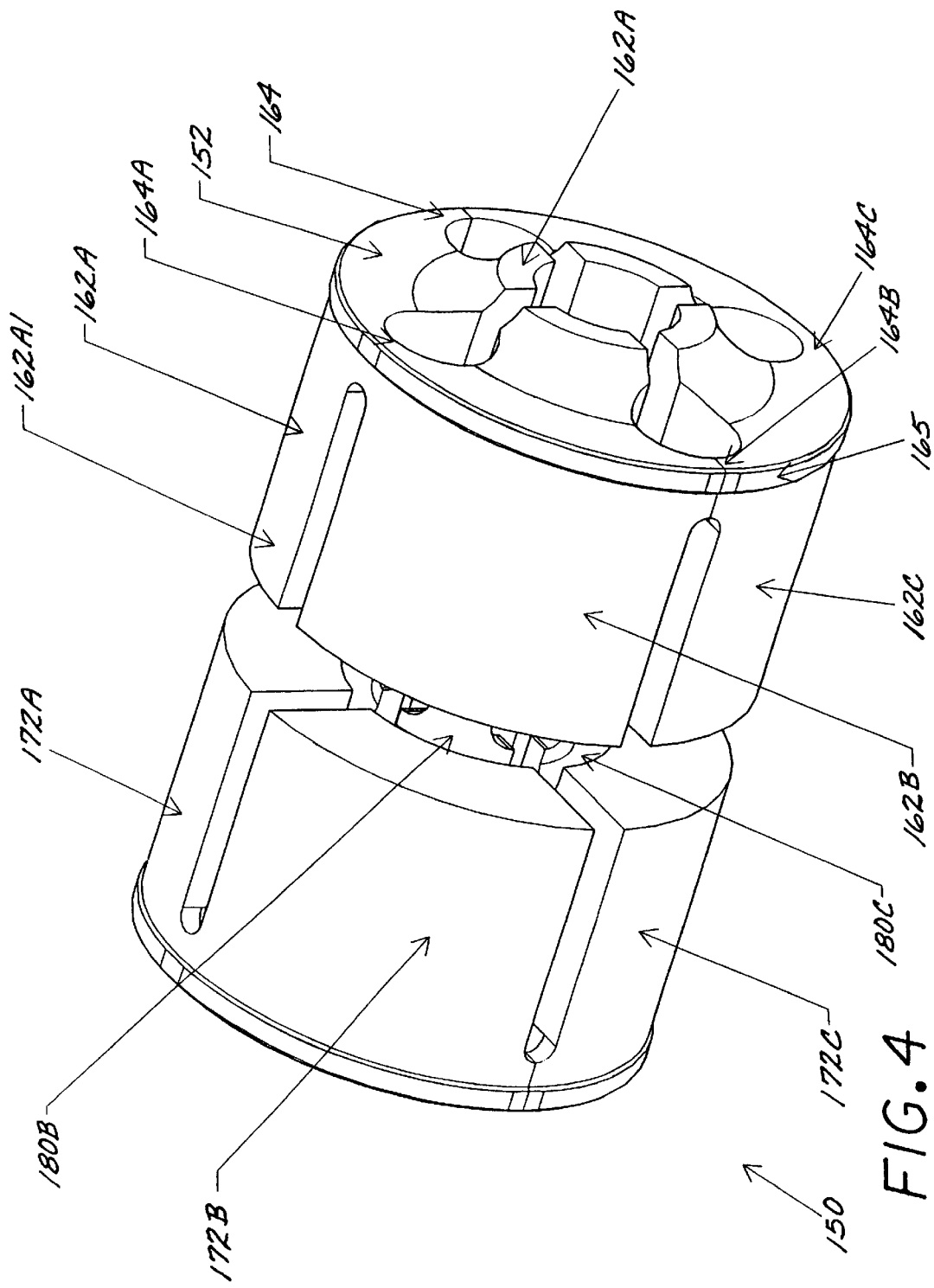
FIG. 4 is an isometric view of a centrifugal chuck comprising the spindle of FIG. 1 showing the forward end of the chuck.
Figure 5:
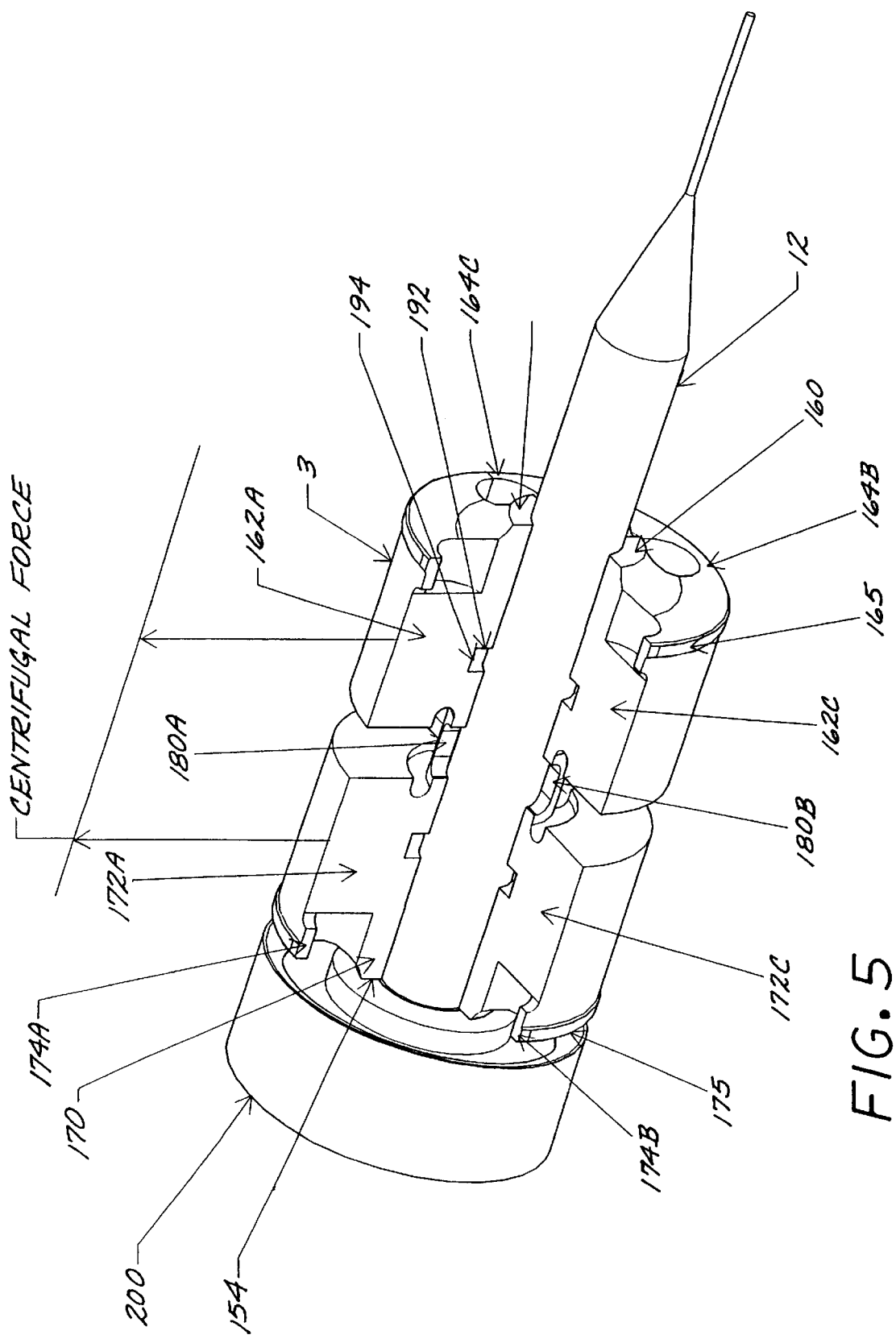
FIG. 5 is an isometric, partially broken away view of the centrifugal chuck of FIG. 4.
Figure 6:
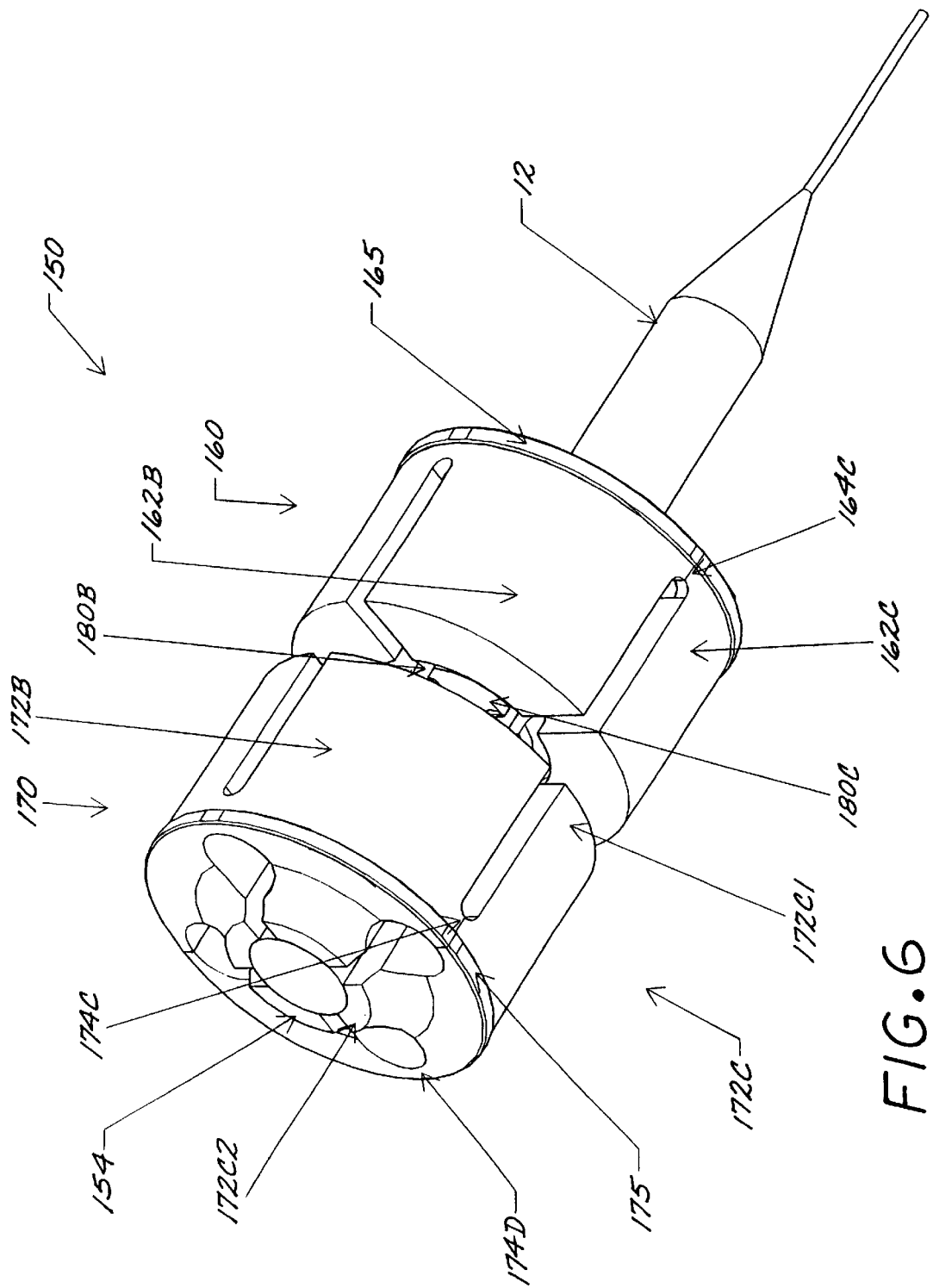
FIG. 6 is an isometric view of the centrifugal chuck, showing the inward end of the chuck.

FIG. 3 is a functional block diagram of the spindle 50 and the ancillary system elements for operating the spindle. These ancillary elements include a controller/motor driver system 30 which generates the motor drive signals for the rotary drive motor 80 and for the linear drive motor 110. A pressurized air supply 32 is connected to the spindle housing to supply the air bearings. A recirculating coolant supply is also connected to the spindle housing to circulate a liquid coolant through the spindle housing.

The Centrifugal Chuck

The centrifugal chuck 150 is illustrated in further detail in FIGS. 4–7. The centrifugal chuck 150 holds the drill bit 10 in place during drilling operations, and is designed to provide the capability to grip the drill shank 12 at two points 152, 154 which are separated along the axis of rotation of the tool shank. Engaging the shank at two points guarantees parallelism of the shank to the axis of rotation.

The chuck 150 is designed in the form of a uni-body flexure which has two gripping segments 160 and 170, the first 160 at the front and the second 170 at the back of the chuck 150. Each gripping segment includes four weights which are joined by flexures to form a uni-body construction. Thus, the first gripping segment 160 includes four weights 162A, 162B, 162C and 162D which are joined adjacent a gripping end by flexures 164A, 164B, 164C and 164D. The second gripping segment 170 includes four weights 172A, 172B, 172C and 172D which are joined by flexures 174A, 174B, 174C and 174D. The joining flexures are disposed well away from the longitudinal center of mass of the respective weights, permitting movement of the weights in a pivoting action in response to centrifugal forces.

The front and back gripping segments are connected with each other by four thin wall flexures 180A, 180B, 180C and 180D. Each weight, when exposed to the spindle rotation, is subjected to centrifugal force which moves it outward. It then rotates around a pivot point defined by a ring of metal protruding from the flexures joining the four weights of each gripping segment, and rests against the interior sleeve 148 fitted into the bore in the spindle shaft. During this motion the gripping end of the weight is closing on the shank 12 of the drill bit 10 to apply force on the drill shaft to provide the drilling torque for the drill bit and to overcome drill bit resistance when entering the material. Thus, for example, weight 162A has a weighted end 162A1 and a gripping end 162A2. The weighted end 162A1 moves outwardly in response to centrifugal force, pivoting about the ring 165 at flexures 164A, 164B to apply leverage force to move gripping end 162A2 inwardly against the shank 12. The ring surface protrudes slightly, by a few thousandths of an inch, from the exterior surface of the chuck. Similarly, exemplary weight 172C (FIG. 6) has a weighted end 172C1 and a gripping end 172C2. The weighted end 172C1 moves outwardly in response to centrifugal force, pivoting about the ring 175 flexures 174C, 174D to apply leverage force to move gripping end 172C2 inwardly against the shank 12. The other weights operate in a similar fashion.

The chuck is fabricated from a block of tool steel, which is machined to produce the uni-body chuck structure.

A rubber O-ring 192 is installed into a groove 194 of the front segment of the chuck to frictionally engage the shank 12, which keeps the drill bit in the centrifugal chuck when it is not rotating. The front ring 165 has a slightly larger outer diameter (by, e.g., 1 inch) than the outer diameter of the ring 175, and is pressed into the sleeve 148. The back segment of the chuck, at ring 175, has a slip fit into the sleeve 148 to allow it to float in the bore when actuated. Behind the chuck 150 is a disk 200 with a threaded hole in the center which allows chuck removal without damage.

The front segment 160 of the chuck 150 is pressed into the sleeve in the spindle shaft and the bore of the chuck is ground on the assembly to guarantee concentricity of the drill shank with the axis of rotation. The front of the chuck is secured by a wire ring 196 (FIG. 1) located in a groove 198, which prevents the chuck from being forced out of the spindle nose.

The chuck can be removed from the rotor shaft by inserting a threaded shaft into the chuck and threading it into the chuck removal disk and then applying force outwardly to the shaft. The disk in that condition is applying force to the chuck and forces it out of the bore of the spindle shaft.

The grip on the drill shank is increasing with the increase of the rpm and it is strongest on the highest rpm. The grip on the drill shank is adequate to be able to rout with 0.062 diameter router in a three high stack of boards each 0.062 thick.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A high speed drilling spindle for a drilling system, comprising:
   a spindle body;
   a rotatable rotor shaft supported within the spindle body for high speed rotation about a rotor axis, said rotor shaft fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body; and
   a rotary drive system for imparting rotational drive forces to the rotor shaft so as to rotate the shaft on the rotary bearing at high speeds.

2. The spindle of claim 1 further comprising a linear drive system for imparting an axially directed drive force to the rotor shaft to perform drilling movements.

3. The spindle of claim 1 wherein said rotary drive system includes a DC brushless permanent magnet motor, said motor comprising a stator assembly including a plurality of stator windings, said stator assembly mounted within said spindle body, and a permanent magnet mounted within an opening formed in said rotor shaft, the magnet having axially extending north and south magnetic poles which are acted upon by magnetic fields established as a result of excitation signals applied to the stator windings to impart rotational forces to the rotor shaft.

4. The spindle of claim 1 wherein said high rotation rates include 200,000 revolutions per minute.

5. The spindle of claim 1 wherein said rotor shaft includes a hollow tubular structure fabricated of said ceramic material.

6. The spindle of claim 5 wherein said rotary drive system includes a magnet disposed within said hollow tubular structure.

7. The spindle of claim 5 wherein said hollow tubular structure has an outer diameter of 0.7 inch, and an inner diameter of 0.5 inch.

8. A high speed drilling spindle comprising:
   a spindle body;
   a rotatable rotor shaft supported within the spindle body for high speed rotation about a rotor axis, said rotor shaft fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body;
   a rotary drive system for imparting rotational drive forces to the rotor shaft so as to rotate the shaft on the rotary bearing at high speeds;
   a linear drive system for imparting axially directed drive forces to the rotor shaft to reciprocate the rotor shaft along a shaft axis, the linear drive system including a linear motor and a magnetically attracted and air-bearing-repelled thrust bearing for coupling the linear drive system to the rotor shaft, said thrust bearing including an air bearing; and
   a centrifugal chuck for holding a tool mounted in a distal end of the ceramic shaft.

9. The spindle of claim 8 wherein the thrust bearing comprises a thrust plate attached at an interior end of the shaft, said linear drive system comprises a magnet attached to a thrust bearing slider structure and positioned adjacent said thrust plate, wherein said magnet and said thrust plate are magnetically attracted to each other, and said thrust air bearing repels said magnetic attraction to prevent said magnet and said thrust plate from coming into contact.

10. The spindle of claim 8 wherein said linear drive system includes a linear drive motor, said linear drive motor comprising an axially movable coil structure having coil windings disposed about the coil structure, a linear motor magnet assembly having core elements fabricated of a magnetic material and one or more permanent magnets, said magnet assembly being stationary with respect to the spindle housing, said coil structure moving axially in response to linear motor drive signals applied to the coil windings.

11. The spindle of claim 10 wherein said coil structure is a cylindrical cupped structure having an open end and a closed end, said coil windings disposed about a periphery of said cupped structure.

12. The spindle of claim 8 herein said shaft comprises a hollow ceramic tube structure, and said chuck is disposed within a sleeve member inserted into said distal end of said ceramic shaft, said sleeve member fabricated of a metal material to relieve localized stresses exerted by the chuck on the ceramic shaft.

13. The spindle of claim 8 wherein said rotary drive system includes a DC brushless permanent magnet motor, said motor comprising a stator assembly including a plurality of stator windings, said stator assembly mounted within said spindle body, and a permanent magnet mounted within an opening formed in said rotor shaft, the magnet having axially extending north and south magnetic poles which are acted upon by magnetic fields established as a result of excitation signals applied to the stator windings to impart rotational forces to the rotor shaft.

14. The spindle of claim 13 wherein the rotor shaft is a hollow ceramic tube having a central opening formed therethrough, and said permanent magnet is disposed within said hollow opening.

15. The spindle of claim 8 wherein said high rotation rates include 200,000 revolutions per minute.

16. The spindle of claim 8 wherein said rotor shaft includes a hollow tubular structure fabricated of said ceramic material.

17. The spindle of claim 16 wherein said rotary drive system includes a magnet disposed within said hollow tubular structure.

18. The spindle of claim 16 wherein said hollow tubular structure has an outer diameter of 0.7 inch, and an inner diameter of 0.5 inch.

19. A centrifugal chuck for use in a spindle, holding a tool having a tool shank in place during high speed rotation to perform tool operations, the chuck adapted to grip the drill shank during rotation at first and second separated points along the shank to guarantee parallelism of the shank to the axis of rotation, the chuck comprising a uni-body flexure which has two gripping segments, the first gripping segment at a front end of the chuck and the second gripping segment at a back end of the chuck, each gripping segment including a plurality of weights distributed about the chuck axis and which are joined by flexures to form a uni-body construction.

20. The chuck of claim 19 wherein said plurality of weights for said first gripping segment consists of four weights segments joined adjacent a first gripping end of the chuck by a first set of corresponding flexures, and said plurality of weights for said second gripping segment includes four weights segments joined adjacent a second gripping end by a second set of corresponding flexures.

21. The chuck of claim 19 wherein said joining flexures are disposed well away from the longitudinal center of mass of the respective weights, permitting movement of the weights in a pivoting action in response to centrifugal forces.

22. The chuck of claim 19 wherein the front and back gripping segments are connected with each other by a plurality of thin wall flexures.

23. The chuck of claim 19 wherein each of said weights includes a gripping end, and each of said two gripping segments includes a pivot ring protruding from the flexures joining the plurality of weights, and each of said plurality of weights, when exposed to the spindle rotation, is subjected to centrifugal force which moves it outward, rotating around the pivot ring, and during this motion the gripping end of the weight is pivoted inwardly, closing on a tool shank to apply force on the tool shank.

24. The chuck of claim 23 wherein the pivot ring has an outer surface protruding slightly from an exterior surface of the chuck.

25. The chuck of claim 19 further including a compressive element installed into a groove formed in the uni-body chuck to frictionally engage the shank and retain the tool in the centrifugal chuck when it is not rotating.

26. The chuck of claim 23 wherein the pivot ring of the first gripping segment has a slightly larger outer diameter than a corresponding outer diameter of the gripping ring of the second gripping segment.

27. A high speed drilling spindle for a drilling system, comprising:
   a spindle body;
   a rotatable rotor shaft supported within the spindle body for high speed rotation about a rotor axis, said rotor shaft fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body;
   a rotary drive system for imparting rotational drive forces to the rotor shaft so as to rotate the shaft on the rotary bearing at high speeds;
   a linear drive system for imparting an axially directed drive force to the rotor shaft to perform drilling movements; and
   a thrust bearing for coupling the linear drive system to the rotor shaft, said thrust bearing including an air bearing and magnetically-attracted thrust surfaces.

28. The spindle of claim 27 wherein the magnetically-attracted thrust surfaces comprise a thrust plate attached at an interior end of the shaft and a magnet attached to a thrust bearing slider structure and positioned adjacent said thrust plate, wherein said magnet and said thrust plate are magnetically attracted to each other, and said air bearing repels said magnetic attraction to prevent said magnet and said thrust plate from coming into contact.

29. A high speed drilling spindle for a drilling system, comprising:
   a spindle body;
   a rotatable rotor shaft supported within the spindle body for high speed rotation about a rotor axis, said rotor shaft fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body;
   a rotary drive system for imparting rotational drive forces to the rotor shaft so as to rotate the shaft on the rotary bearing at high speeds;
   a chuck for holding a tool mounted in a distal end of said ceramic shaft; and
   wherein said shaft comprises a hollow ceramic tube structure, and said chuck is disposed within a sleeve member inserted into said distal end of said ceramic shaft, said sleeve member fabricated of a metal material to relieve localized stresses exerted by the chuck on the ceramic shaft.

30. A high speed drilling spindle for a drilling system, comprising:
   a spindle body;
   a rotatable rotor shaft supported within the spindle body for high speed rotation about a rotor axis, said rotor shaft a hollow tube having a central opening formed therethrough and fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body; and
   a rotary drive system for imparting rotational drive forces to the rotor shaft so as to rotate the shaft on the rotary bearing at high speeds, said rotary drive system including a DC brushless permanent magnet motor, said motor comprising a stator assembly including a plurality of stator windings, said stator assembly mounted within said spindle body, and a permanent magnet mounted within said tube central opening, the magnet having axially extending north and south magnetic poles which are acted upon by magnetic fields established as a result of excitation signals applied to the stator windings to impart rotational forces to the rotor shaft.

31. A high speed drilling spindle for a drilling system, comprising:
   a spindle body;
   a rotatable rotor shaft supported within the spindle body for high speed rotation about a rotor axis, said rotor shaft fabricated of a ceramic material capable of withstanding centrifugal forces exerted during high rotation rates without significant diametrical growth of the rotor shaft;
   a rotary bearing for supporting the rotor shaft for high speed rotation with low frictional drag within the spindle body;
   a rotary drive system for imparting rotational drive forces to the rotor shaft so as to rotate the shaft on the rotary bearing at high speeds; and
   a linear drive system for imparting an axially directed drive force to the rotor shaft to perform drilling movements, said linear drive system including a linear drive motor, a thrust bearing slider structure and a thrust bearing for coupling the thrust bearing slider structure to the rotor shaft, said linear motor drive comprising an axially movable coil structure having coil windings disposed about the coil structure, a linear motor magnet assembly having core elements fabricated of a magnetic material and one or more permanent magnets, said magnet assembly being stationary with respect to the spindle housing, said coil structure moving axially in response to linear motor drive signals applied to the coil windings.

32. The spindle of claim 31 wherein said coil structure is a cylindrical cupped structure having an open end and a closed end, said coil windings disposed about a periphery of said cupped structure.

33. The spindle of claim 32 wherein said linear motor magnet assembly is supported within said open end of said cupped structure.

34. The spindle of claim 1 further comprising a chuck for holding a tool mounted in a distal end of said ceramic shaft.

* * * * *